(12) United States Patent
Morita et al.

(10) Patent No.: US 8,451,263 B2
(45) Date of Patent: May 28, 2013

(54) DRIVING CIRCUIT AND LIQUID CRYSTAL DISPLAY DEVICE USING THE SAME

(75) Inventors: Tetsuo Morita, Saitama-ken (JP); Hiroyuki Kimura, Saitama-ken (JP)

(73) Assignee: Japan Display Central Inc., Fukaya-shi (JP)

( * ) Notice: Subject to any disclaimer, the term of this patent is extended or adjusted under 35 U.S.C. 154(b) by 147 days.

(21) Appl. No.: 13/012,209

(22) Filed: Jan. 24, 2011

(65) Prior Publication Data

US 2011/0181586 A1 Jul. 28, 2011

(30) Foreign Application Priority Data

Jan. 25, 2010 (JP) ................................. 2010-013541

(51) Int. Cl.
*G06F 3/038* (2006.01)
*G09G 5/00* (2006.01)

(52) U.S. Cl.
USPC ........................................................ 345/214

(58) Field of Classification Search
None
See application file for complete search history.

(56) References Cited

U.S. PATENT DOCUMENTS

2004/0095306 A1* 5/2004 Fujiyoshi ......................... 345/94
2004/0263501 A1* 12/2004 Yamashita et al. ............ 345/204
2007/0296662 A1* 12/2007 Lee et al. ......................... 345/87
2009/0261896 A1* 10/2009 Tzu-Chien et al. ............ 327/543
2010/0245305 A1* 9/2010 Yokoyama et al. ............ 345/205

FOREIGN PATENT DOCUMENTS

JP 2005-173244 6/2005
JP 2006-276541 10/2006
WO WO 2009084280 A1 * 7/2009

* cited by examiner

*Primary Examiner* — Bipin Shalwala
*Assistant Examiner* — Kwin Xie
(74) *Attorney, Agent, or Firm* — Oblon, Spivak, McClelland, Maier & Neustadt, L.L.P.

(57) ABSTRACT

In one embodiment, a driving circuit includes first, second, third and fourth transistors each having first and second electrodes, and a control gate electrode. First and second input signals for producing alternating current voltage are inputted to the respective first electrodes of the first and second transistors. The first electrode of the third transistor and the second electrode of the fourth transistor are commonly connected with an output terminal. The second electrode of the third transistor and the first electrode of the fourth transistor are respectively connected with first and second voltage sources. The control gate electrodes of the third and fourth transistors are respectively connected with the second electrodes of the first and second transistors. The driving circuit further includes first and second potential holding devices to control the switching operation of the third and fourth transistors to output the first and second voltages.

4 Claims, 6 Drawing Sheets

DRIVING CIRCUIT AND LIQUID CRYSTAL DISPLAY DEVICE USING THE SAME

CROSS-REFERENCE TO RELATED APPLICATION

This application is based upon and claims the benefit of priority from prior Japanese Patent Application No. 2010-013541, filed Jan. 25, 2010, the entire contents of which are incorporated herein by reference.

FIELD

The present invention relates to a driving circuit formed of single channel type transistors of PMOS transistor or NMOS transistor and a liquid crystal display device using the driving circuit.

BACKGROUND

As a display device for a cell-phone unit and a personal computer, a liquid crystal display device is used widely.

For example, the liquid crystal display device includes a pair of substrates arranged opposing each other, a liquid crystal layer held between the substrates, a display portion consisting of a plurality of display pixels arranged in the shape of a matrix, and a driving circuit to drive the display pixels.

Pixel electrodes are arranged on one of the substrates in the shape of a matrix so that the pixel electrode corresponds to each display pixel. On the other substrate, a counter electrode is arranged so as to oppose to the pixel electrodes. The alignment state of crystal molecules constituting the liquid crystal layer is controlled by a voltage applied between the pixel electrode and the counter electrode.

When a constant voltage (direct-current voltage) has been impressed to the liquid crystal layer for a long time, inclination of the liquid crystal molecules is fixed. Therefore, the liquid crystal molecular inclination of the liquid crystal layer causes persistence of image and further a short life. In order to prevent the unfavorable phenomenon, the voltage impressed to the liquid crystal layer is alternately changed for every definite period. That is, the voltage impressed to the pixel electrode is changed to a positive voltage side and a negative voltage side for every definite period with respect to the voltage applied to the counter electrode in the liquid crystal display device.

As a driving method for impressing the alternating current voltage to the liquid crystal layer, for example, Japanese Laid Open Patent Application No. 2005-173244 proposes a capacity coupling (CC) driving method. In the capacity coupling (CC) driving method, when the pixel switch is turned off (non-conductive state), amount of change of the pixel electrode potential is made larger than that of the signal voltage supplied to a signal line by controlling the voltage of an auxiliary capacity line.

In the liquid crystal display device using the capacity coupling driving method, when the driving circuit for driving the auxiliary capacity line is constituted by a CMOS circuit, the manufacturing process steps may increase. Conventionally, in order to prevent the increase of the manufacturing steps, Japanese Laid Open Patent Application No. 2006-276541 proposes a technique in which the driving circuit for driving the auxiliary capacity lines is formed of either one of PMOS transistor or NMOS transistor.

However, while the miniaturization of the transistor progresses by the development of the manufacturing process technology in recent years, when the transistor is OFF, an OFF leakage current may flow. When an excessive OFF leakage current flows into the transistor, the ON and OFF switching operation of the transistor in the auxiliary capacity line driving circuit could not be controlled normally, and the auxiliary capacity line driving circuit may malfunction.

Moreover, it is considered to make the value of a retention capacity connected with the auxiliary capacity line large to decrease the fluctuation of the potential of the lines in the floating state even if the excessive off-leakage current flows into the transistor. When the value of the retention capacity is enlarged, the width of the frame surrounding the display portion becomes large by the capacity area, and further the external dimensions of the liquid crystal display device module may also become large.

Furthermore, when writing a potential through the transistor into scanning lines, the writing of the potential may not complete, and the potential may not be written sufficiently during a high level period due to taking time. Also in this case, the auxiliary capacity line driving circuit may malfunction.

BRIEF DESCRIPTION OF THE DRAWINGS

The accompanying drawings, which are incorporated in and constitute a part of the specification, illustrated embodiments of the invention, and together with the general description given above and the detailed description of the embodiments given below, serve to explain the principles of the invention.

DETAILED DESCRIPTION OF THE INVENTION

Figure 1:
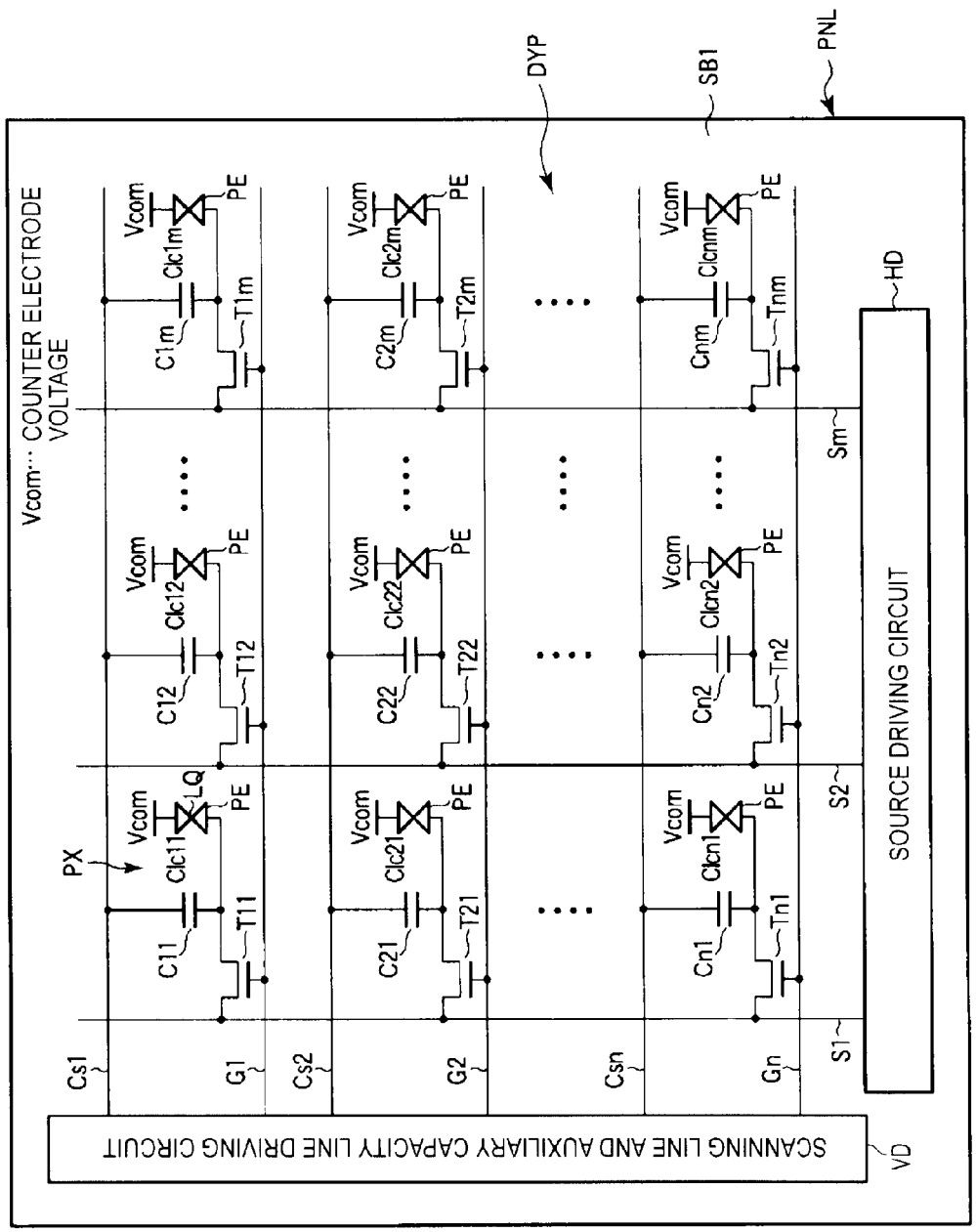
FIG. 1 is a figure schematically showing a structure of a liquid crystal display device according to one embodiment of the present invention.

A driving circuit and a liquid display device using the same according to an exemplary embodiment of the present invention will now be described with reference to the accompanying drawings wherein the same or like reference numerals designate the same or corresponding parts throughout the several views.

In one embodiment, a driving circuit includes: a first transistor having a first electrode, a second electrode and a control gate electrode, the first electrode receiving a first input signal and the control electrode receiving a clock signal; a second transistor having a first electrode, a second electrode and a control gate electrode, the first electrode receiving a second input signal and connected with the control gate of the; a third transistor having a first electrode connected with an output terminal, a control gate electrode connected with the second electrode of the first transistor and a second electrode to receive a first voltage; a fourth transistor having a control gate electrode connected with the second electrode of the second transistor, a second electrode connected with the output terminal and a first electrode to receive a second voltage; a first potential holding device to maintain a conductive state between the first and second electrodes of the third transistor by holding the potential of the control gate electrode of the third transistor at a predetermined level when the first transistor is nonconductive state; and a second potential holding device to maintain a conductive state between the first and second electrodes of the fourth transistor by holding the potential of the control gate electrode of the fourth transistor at the predetermined level when the second transistor is nonconductive state.

According to other embodiment, a liquid crystal display device includes: a plurality of pixels arranged in a matrix; scanning lines arranged along a row line to sequentially select the pixels arranged in the row line; source lines connected with the pixels to write image data into the pixels selected by the scanning lines; auxiliary capacity lines extending along the pixels in the row line; and auxiliary capacity line driving circuit to drive the auxiliary capacity lines; auxiliary capacity line driving circuit including; a first transistor having a first electrode, a second electrode and a control gate electrode, the first electrode receiving a first input signal and the control electrode receiving a clock signal; a second transistor having a first electrode, a second electrode and a control gate electrode, the first electrode receiving a second input signal and connected with the control gate of the; a third transistor having a first electrode connected with an output terminal, a control gate electrode connected with the second electrode of the first transistor and a second electrode to receive a first voltage; a fourth transistor having a control gate electrode connected with the second electrode of the second transistor, a second electrode connected with the output terminal and a first electrode to receive a second voltage; a first potential holding device to maintain a conductive state between the first and second electrodes of the third transistor by holding the potential of the control gate electrode of the third transistor at a predetermined level when the first transistor is nonconductive state; and a second potential holding device to maintain a conductive state between the first and second electrodes of the fourth transistor by holding the potential of the control gate electrode of the fourth transistor at the predetermined level when the second transistor is nonconductive state;

Hereafter, a liquid crystal display device according to the first embodiment is explained with reference to FIG. 1. The liquid crystal display device includes a pair of substrates and a liquid crystal layer held between the substrates.

The liquid crystal layer includes an array substrate SB1 and a counter substrate (not shown) opposing the array substrate SB1, a liquid crystal layer LQ held between the array substrate SB1 and the counter substrate, and a display portion DYP including a plurality of display pixels PX arranged in the shape of a matrix.

The array substrate SB1 includes pixel electrodes PE arranged in the shape of a matrix so as to correspond to each display pixel PX, a plurality of scanning lines G (G1, G2, - - - Gn) extending along with the pixel electrodes PE arranged in a row line, and auxiliary capacity lines Cs (Cs1, Cs2, - - - Csn), a plurality of signal lines S (S1, S2, - - - Sm) extending along with the pixel electrodes PE arranged in a column line, pixel switches T (T11-Tnm) arranged near the positions where the scanning lines G and the signal lines S cross, a scanning line and auxiliary capacity line driving circuit VD for driving a plurality of scanning lines G and auxiliary capacity lines Cs, and a source driving circuit HD to drive a plurality of signal lines S. The counter substrate includes a counter electrode arranged so as to oppose to the pixel electrodes PE.

The pixel switch T is, for example, formed of a thin film transistor. The control electrode of the pixel switch T is electrically connected with the corresponding scanning line G (or formed integrally). The source electrode of the pixel switch T is electrically connected with the corresponding signal line S (or formed integrally). The drain electrode of the pixel switch T is electrically connected with the corresponding pixel electrode PE (or formed integrally).

Figure 2:
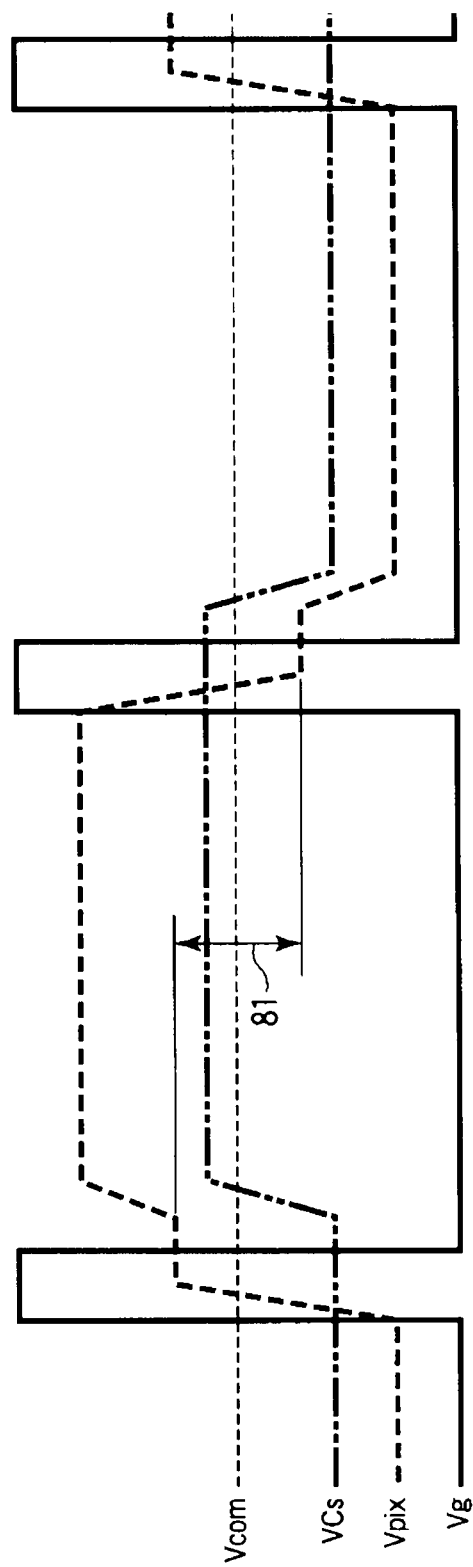
FIG. 2 is a figure for explaining a driving circuit for driving a scanning line and an auxiliary capacity line of the liquid crystal display device according one embodiment of the present invention.

The scanning line and auxiliary capacity line driving circuit VD drives a plurality of scanning lines sequentially by setting the gate voltage supplied to the scanning lines G to a high-level in a predetermined timing as shown in FIG. 2. If the scanning lines G are driven, the electrical path between the source electrode and the drain electrode of the pixel switch T becomes conductive. The source driving circuit HD supplies image signal corresponding to each of the signal lines S. The image signal supplied to the signal line S is supplied to the pixel electrode PE through the pixel switch T. A counter electrode voltage Vcom is supplied to the counter electrode from a counter electrode driving circuit which is not illustrated. The liquid crystal capacity Clc (Clc11-Clcnm) is formed by a pixel electrode potential Vpix of the pixel electrode PE and the counter electrode potential Vcom of the counter electrode in each of the pixels PX.

After the scanning line and auxiliary capacity line driving circuit VD drives the scanning line G, the driving circuit VD drives the auxiliary capacity lines Cs corresponding to the same display pixel PXs arranged in the row line and raises the potential Vcs of the auxiliary capacity line Cs. As shown in FIG. 2, the voltage is supplied to the auxiliary capacity line Cs so that the potential of the auxiliary capacity line Cs may change in a polar direction of the pixel electrode potential Vpix with respect to the counter electrode potential Vcom. The auxiliary capacity C (C11-Cnm) is formed of the potential of the auxiliary capacity line Cs and the potential of the pixel electrode potential Vpix, and is combined with the liquid crystal capacity Clc.

Moreover, in a next one-frame period, the image signal of negative polarity is supplied to the pixel electrode PE. In this one-frame period, after the scanning line and auxiliary capacity line driving circuit VD drives the scanning line G, the driving circuit VD lowers the pixel electrode potential Vpix by dropping the potential Vcs of the auxiliary capacity line Cs.

Accordingly, as shown in FIG. 2, the amplitude of the pixel electrode potential Vpix becomes larger than the amplitude 81 of the image signal supplied to the signal line S by changing the potential of the auxiliary capacity line Cs. Thus, low power consumption of the liquid crystal display device is realized by making the pixel electrode potential Vpix impressed to the pixel electrode PE larger than the amplitude 81 of the image signal supplied to the signal line S.

Figure 3:
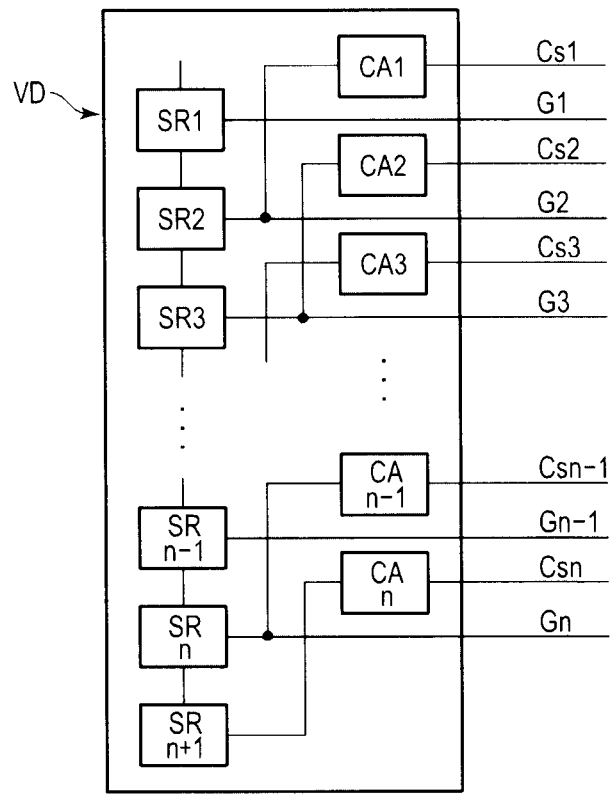
FIG. 3 is a figure for explaining an auxiliary capacity line driving circuit of the liquid crystal display device according to one embodiment of the present invention.

The scanning line and auxiliary capacity line driving circuit VD includes a plurality of scanning line driving circuits (shift register circuits) SR1-SRn+1 and a plurality of auxiliary capacity line driving circuits CA1-CAn as shown in FIG. 3. The scanning lines G1-Gn are electrically connected to each of the scanning line driving circuits SR1-SRn. The output signals of the scanning line driving circuit SR2-SRn+1 are respectively supplied also to the auxiliary capacity line driving circuits CA1-CAn.

Figure 5:
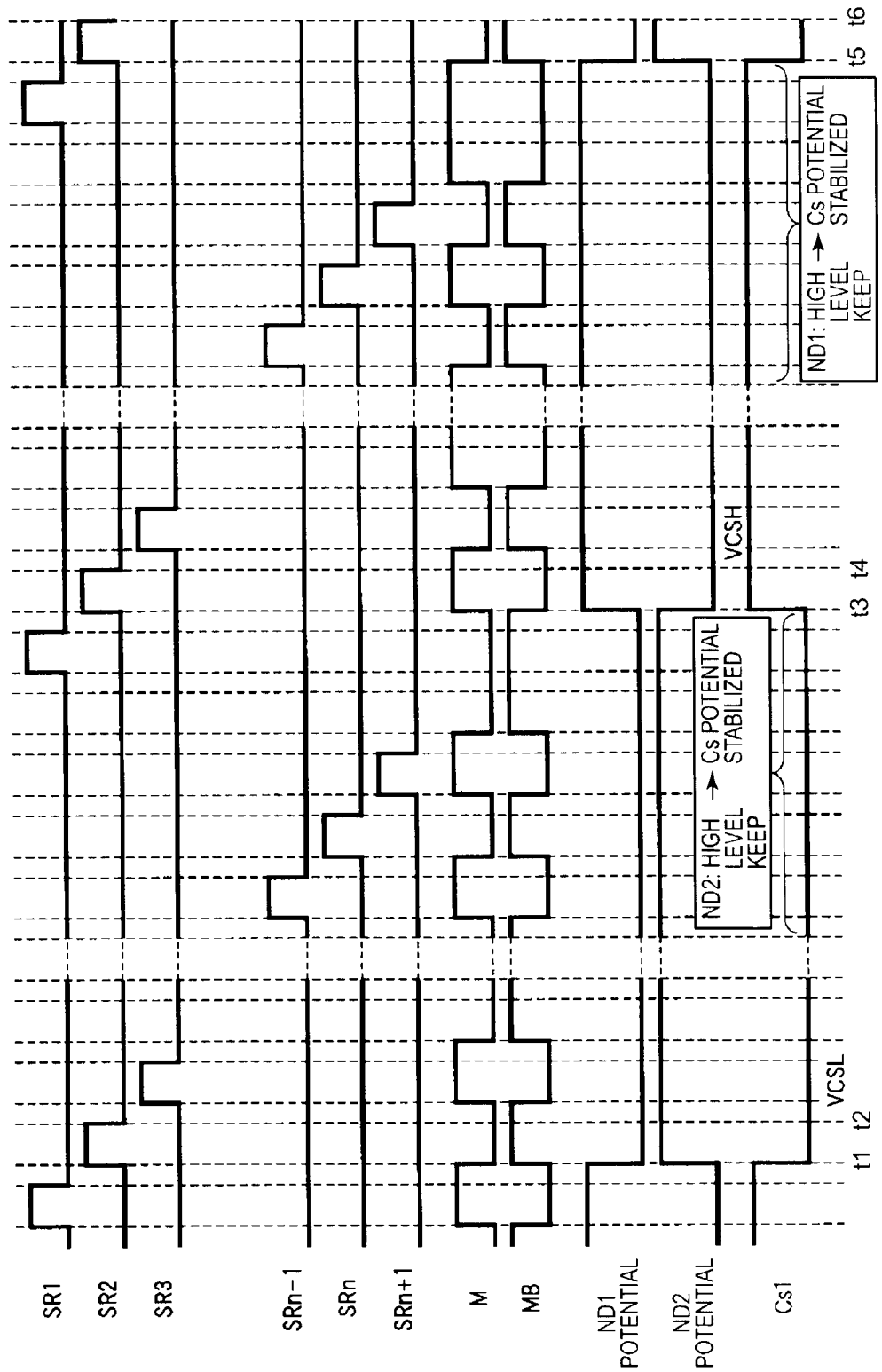
FIG. 5 is a timing chart to explain the driving method of the liquid crystal display device according to one embodiment of the present invention.

A clock pulse is supplied to the scanning line driving circuit SR1 from a controller which is not illustrated. The scanning line driving circuit SR1 drives a scanning line G1 upon receiving a clock pulse and shifts the clock pulse to the next scanning line driving circuit SR2. Then, the scanning line driving circuit SR2 drives a scanning line G2 and shifts the clock pulse to the next scanning line driving circuit SR3. Similarly, the clock pulse is shifted to the scanning line driving circuits SR3-SRn one by one, and the scanning line driving circuits SR3-SRn are driven. The scanning line selection signals to drive the scanning lines G1-Gn one by one are outputted from the scanning line driving circuits SR1-SRn as shown in FIG. 5.

At the same time, when the plurality of scanning lines G1-Gn are driven sequentially, the scanning line selection signals of the scanning lines G1-Gn outputted from the scanning line driving circuits SR2-SRn are also supplied to the auxiliary capacity line driving circuits CA1-CAn−1. The output signal of the scanning line driving circuit SRn+1 is supplied only to the auxiliary capacity line driving circuit CAn.

Figure 4:
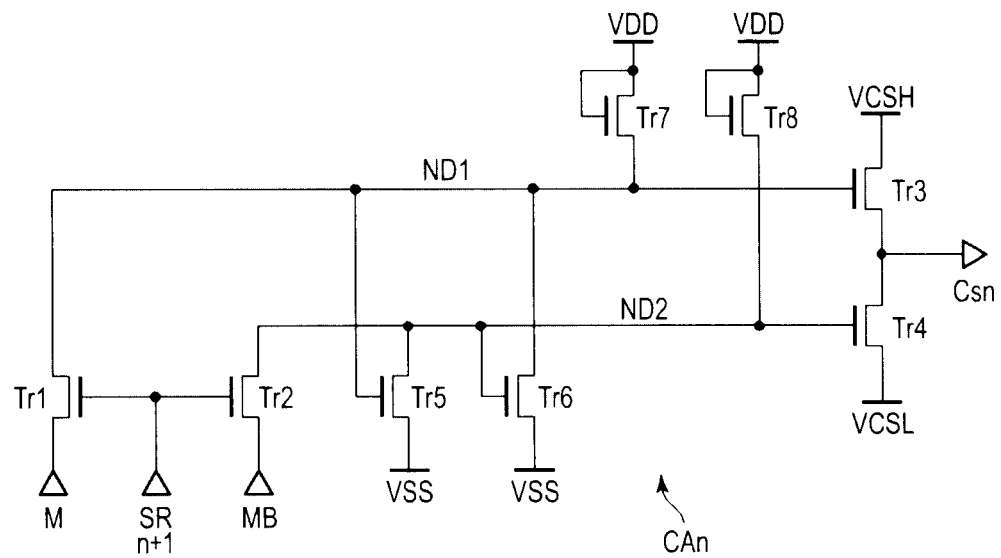
FIG. 4 is a driving circuit used in the liquid crystal display device according to one embodiment of the present invention.

Hereinafter, a driving circuit CA for driving the auxiliary capacity line is explained. Although FIG. 4 schematically shows one of the auxiliary capacity line driving circuits CAn, the structures of other auxiliary capacity line driving circuits CA1-CAn−1 are also the same. As shown in FIG. 4, the auxiliary capacity line driving circuit CAn includes a plurality of transistors Tr1-Tr8. The transistors Tr1-Tr8 are formed of single channel transistors, that is, NMOS transistors.

The scanning line selection signal VSRn+1 outputted from the scanning line driving circuit SRn+1 is supplied to the control electrodes of the first transistor Tr1 and the second transistor Tr2. The scanning line selection signal VSRn+1 is the (n+1)th order scanning line selection signal outputted from the scanning line driving circuit SRn+1, and the scanning line selection signal VSRn+1 is a clock signal to turn on and turn off the first and second transistors Tr1 and Tr2 in a predetermined cycle.

A signal for producing an alternating current voltage (a first input signal) M is supplied to the source electrode of the first transistor Tr1. The drain electrode of the first transistor Tr1 is electrically connected with a first node ND1. The first node ND1 is electrically connected with the control electrode of the third transistor Tr3. That is, the signal for producing the alternating current voltage M supplied to the first node ND1 through the first transistor circuit Tr1 is supplied to the control electrode of the third transistor Tr3.

A signal for producing an alternating current voltage (a second input signal) MB is supplied to the source electrode of the second transistor Tr2. The drain electrode of the second transistor circuit Tr2 is electrically connected with a second node ND2. The second node ND2 is electrically connected with the control electrode of the fourth transistor Tr4. That is, the signal for producing the alternating current voltage MB supplied to the second node ND2 through the second transistor circuit Tr2 is applied to the control electrode of the fourth transistor circuit Tr4.

A common voltage VCSH of positive polarity supplied to the auxiliary capacity line Csn is supplied to the source electrode of the third transistor Tr3. A common voltage VCSL of negative polarity supplied to the auxiliary capacity line Csn is supplied to the source electrode of the fourth transistor Tr4. The drain electrodes of the third transistor Tr3 and the fourth transistor Tr4 are commonly and electrically connected with the auxiliary capacity line Csn.

The control electrode of the fifth transistor circuit Tr5 is electrically connected with the first node ND1. A first reference voltage VSS is supplied to the source electrode of the fifth transistor Tr5. The drain electrode of the fifth transistor Tr5 is electrically connected with the second node ND2.

The control electrode of the sixth transistor Tr6 is electrically connected with the second node ND2. The first reference voltage VSS is supplied to the source electrode of the sixth transistor Tr6. The drain electrode of the sixth transistor circuit Tr6 is electrically connected with the first node ND1.

The control electrode of the seventh transistor Tr7 is electrically connected with its source electrode. A second reference voltage VDD is supplied to the control and source electrodes of the seventh transistor Tr7. The drain electrode of the seventh transistor circuit Tr7 is electrically connected with the first node ND1.

The control electrode of the eighth transistor Tr8 is electrically connected with its source electrode. The second reference voltage VDD is supplied to the control and source electrodes of the eighth transistor Tr8. The drain electrode of the eighth transistor Tr8 is electrically connected with the second node ND2.

In the liquid crystal display device display device according to this embodiment, the second reference voltage VDD is the voltage corresponding to the high level of the signals M and MB for producing the alternating current voltages, and the first reference voltage VSS is the voltage corresponding to the low level of the signals M and MB.

As shown in FIG. 5, when the scanning line selection signal VSRn+1 is high level, and the signals M and MB for producing alternating current voltage are respectively high level and low level, the potential of the first node ND1 and the second node ND2 become the high level and the low level, respectively.

Here, since the potentials of the first node ND1 and the second node ND2 are maintained during for one-frame period even if the scanning line selection signal VSRn+1 becomes the low level, the common voltage VCSH of positive polarity is outputted during the one-frame period as an output to the auxiliary capacity line Csn.

That is, while the scanning line selection signal VSRn+1 becomes the low level, and the first transistor Tr1 and the second transistor Tr2 are turned off, the second reference voltage VDD is continuously supplied to the first node ND1 through the seventh transistor Tr7.

When the scanning line selection signal VSRn+1 is high-level, and the signals M and MB for producing alternating current voltages are respectively low level and high level, the potential of the first node ND1 and the second node ND2 become low level and high level, respectively. Since the potentials of the first node ND1 and the second node ND2 are maintained during for one-frame period, a common voltage VCSL of negative polarity is outputted during the one-frame period as the output to the auxiliary capacity line Csn.

That is, while the scanning line selection signal VSRn+1 becomes the low level, and the first transistor Tr1 and the second transistor Tr2 are turned off, the second reference voltage VDD is continuously supplied to the second node ND2 through the eighth transistor Tr8. Thus, in the liquid crystal display device according to this embodiment, the producing of the alternating current voltage applied to the auxiliary capacity line Csn is enabled.

As mentioned above, the high-level voltage VDD is continuously applied to the first node ND1 and the second node ND2 in the auxiliary capacity line driving circuit CAn through the seventh transistor Tr7 and eighth transistor Tr8.

According to this embodiment, since the first node ND1 in the high-level state is not electrically floating state during a period t4-t5, the high-level state can be maintained in a stable condition. Similarly, since the second node ND2 in the high-level state is not electrically floating state during a period t2-t3, the high-level state can be also maintained in a stable condition. In addition, although the electrical change of each node in the auxiliary capacity line driving circuit CA1 is shown as an example in FIG. 5, it is the same about other auxiliary capacity line driving circuits CA2-CAn.

In case the seventh transistor Tr7 and the eighth transistor Tr8 are not provided here, the first node ND1 and the second nodes ND2 become electrically floating state during the period when the first transistor Tr1 and second the transistor Tr2 are turned off. Therefore, it becomes difficult to set one of the first node ND1 and the second node ND2 to high level, and the other to low level in order to make the third transistor Tr3 or the fourth transistor Tr4 ON state for a fixed period to supply the common voltages.

Figure 8:
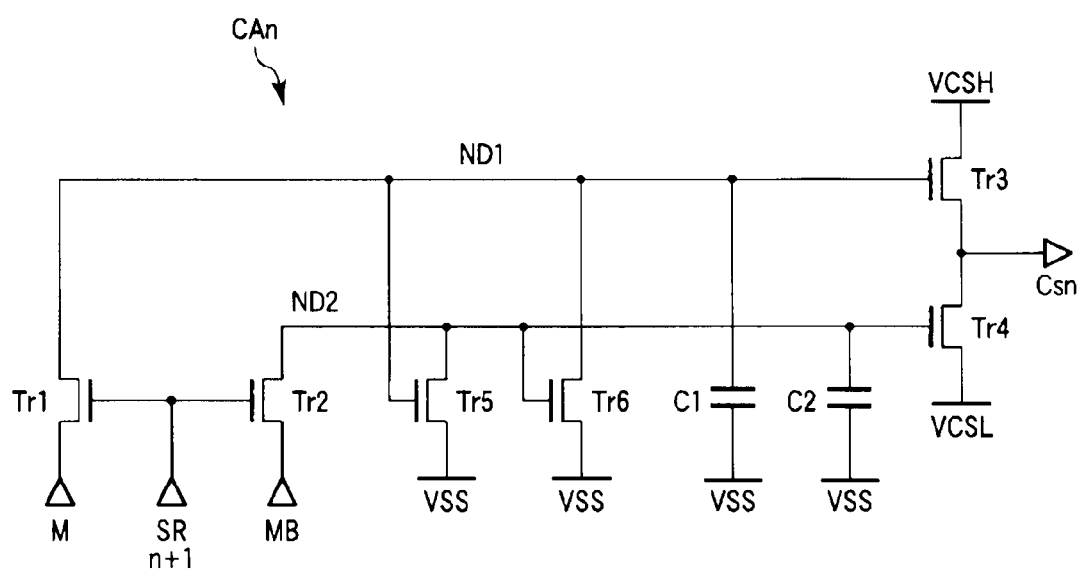
FIG. 8 is a figure showing a comparison auxiliary capacity line driving circuit used in the liquid crystal display device.

Then, if retention capacities C1 and C2 are respectively connected between the first node ND1 and the first reference voltage line, and between the second node ND2 and the first reference voltage line to which the first reference voltage VSS is supplied as shown in FIG. 8, the voltage of the first node ND1 and the second node ND2 can be stabilized.

Moreover, when one of the first node ND1 and the second node ND2 is high-level, the other node can be made into a low level any time by connecting the fifth transistor Tr5 and the sixth transistor Tr6 to the first node ND1 and the second node ND2, respectively.

However, in this structure, when excessive OFF leakage current flows into the transistors Tr5 and Tr6, the potential of the first node ND1 and the second node ND2 is fluctuated, and it becomes impossible to normally control the ON and OFF switching operation of the third transistor Tr3 and the fourth transistor Tr4.

In the auxiliary capacity line driving circuit shown in FIG. 8, if the OFF leakage current of the first transistor Tr1 and the sixth transistor Tr6 is large, current flows to the first reference voltage VSS side from the first node ND1 (floating node) in a high-level state through the sixth transistor Tr6 during the period t4-t5. Moreover, when the signal M for producing the alternating current voltage is in the low level state, current flows to the signal M side through the first transistor Tr1 from the first node ND1 (floating node) in the high-level state.

Since the first node ND1 is electrically floating state, the potential of the first node ND1 is lowered, the third transistor Tr3 turns off, and it becomes impossible to supply the VCSH voltage to the auxiliary capacity line Cs due to the leakage current. As a result, the potential of the auxiliary capacity line Cs changed into the floating state fluctuates, and poor image quality may be caused.

Similarly, if the OFF leakage current of the second transistor Tr2 and the fifth transistor Tr5 is large, current flows to the first reference voltage VSS side from the floating node (second node ND2) in the high-level state through the fifth transistor Tr5 during the period t2-t3. Moreover, when the signal MB is in the low level state, current flows to the signal MB side from the floating node (second node ND2) in the high-level state through the second transistor circuit Tr2.

Therefore, since the second node ND2 is electrically floating state, the potential of the second node ND2 is lowered, the fourth transistor Tr4 turns off, and it becomes impossible to supply the VCSL voltage to the auxiliary capacity line Cs due to the leakage current. As a result, the potential of the auxiliary capacity line Cs changed into the floating state fluctuates, and poor image quality may be caused.

Moreover, if the retention capacity values of C1 and C2 are set to large values so that the potential change of the first node ND1 and the second node ND2 may decrease even if the excessive OFF leakage current flows into the transistors, the width of the circuit frame arranged around the display portion DYP becomes large, which results in the enlargement of the outside dimensions of the display device.

Furthermore, when writing the signals M and MB to the first node ND1 and the second node ND2 through the first transistor Tr1 and the second transistor Tr2, the writing of the signals M and MB into the retention capacities C1 and C2 respectively connected with the first and second nodes ND1 and ND2 may not complete during the period t1-t2, the period t3-t4, and the period t5-t6 in which the scanning line selection signal VSR2 is high level. Moreover, insufficient writing that first node ND1 and the second node ND2 do not reach to a predetermined voltage value may be caused. The insufficient writing results in malfunction of the ON and OFF switching operation of the third transistor Tr3 and the fourth transistor Tr4.

On the other hand, in the liquid crystal display device according to this embodiment, the first node ND1 and the second node ND2 become electrically non-floating state by providing the seventh transistor Tr7 and the eighth transistor Tr8. Therefore, it becomes possible to make the values of the retention capacities C1 and C2 shown in FIG. 8 small or to omit the retention capacities C1 and C2. As a consequence, it becomes possible to make the auxiliary capacity line driving circuit CA small and to achieve a narrow frame.

In addition, in the auxiliary capacity line driving circuit CAn shown in FIG. 4, it is preferable to set a ratio W/L (W: channel width, L: channel length) of the seventh transistor Tr7 and the eighth transistor Tr8 sufficiently smaller than that of the fifth transistor Tr5 and the sixth transistor Tr6.

Although both the eighth transistor Tr8 and the fifth transistor Tr5 turn on during the period t3-t5, the ratio W/L of the eighth transistor Tr8 is set sufficiently smaller than that of the fifth transistor Tr5 so that the second node ND2 can maintain the low level state.

Thus, if the ratio W/L is set as above, the second node ND2 becomes in the low level state, the fourth transistor circuit Tr4 does not turn on during the period t3-t5, and the auxiliary capacity line driving circuit CA operates in a stabilized condition.

Moreover, a penetration current flowing to the first reference voltage VSS side from the second reference voltage VDD through the eighth transistor Tr8 and the fifth transistor Tr5 can be made small. Therefore, power consumption which increases by providing the eighth transistor Tr8 can be made small enough.

Similarly, although both the seventh transistor Tr7 and the sixth transistor Tr6 turn on during the period t1-t3, the ratio W/L of the seventh transistor Tr7 is set smaller enough than that of the sixth transistor Tr6 so that the first node ND1 can maintain the low level state.

Thus, if the ratio W/L is set as above, the first node ND1 becomes in the low level state, and the third transistor Tr3 does not turn on during the period t1-t3. Accordingly, the auxiliary capacity line driving circuit CA operates in a stabilized condition.

Moreover, the penetration current which flows to the first reference voltage VSS side from the second reference voltage VDD through the seventh transistor Tr7 and the sixth transistor Tr6 can be made small. Therefore, power consumption which increases by providing the seventh transistor Tr7 can be made small enough.

As mentioned above, in the liquid crystal display device according to this embodiment, it becomes possible to offer the display device equipped with the auxiliary capacity line driving circuit formed of the single channel type transistor and having the floating node, in which the circuit malfunction can be prevented resulting from the excessive OFF leakage current flowing into the transistor. That is, according to this embodiment, the malfunction of the driving circuit can be avoided, and the high quality display device can be offered.

Next, a liquid crystal display device according to a second embodiment of the present invention is explained with reference to drawings. In addition, in the following explanation about the same composition as the display device in the first embodiment, the same mark is attached and the explanation is omitted.

Figure 6:
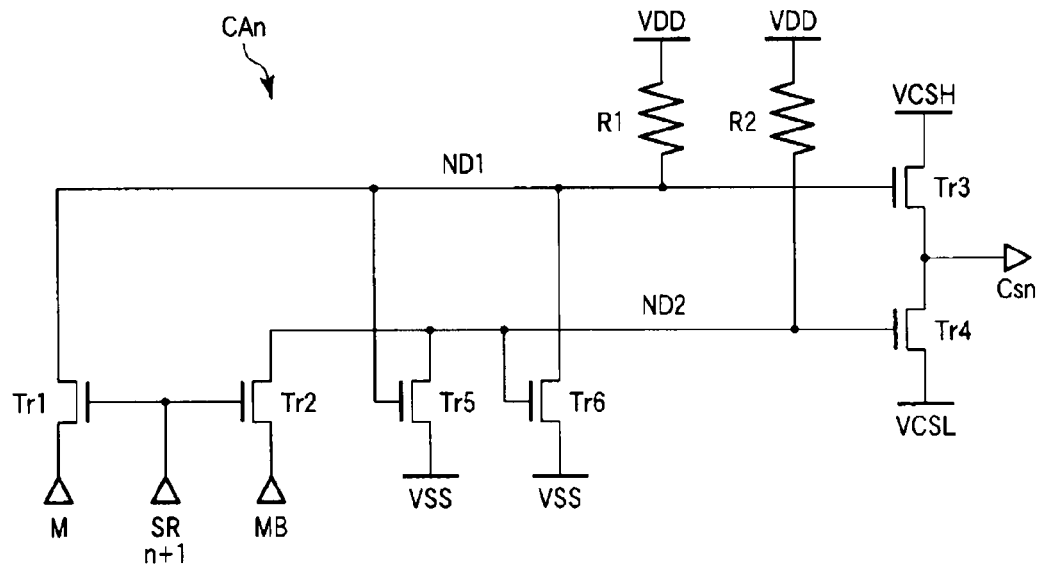
FIG. 6 is a figure showing an auxiliary capacity line driving circuit used in the liquid crystal display device according to a second embodiment.

The liquid crystal display device according to this embodiment, the structures other than the auxiliary capacity line driving circuit CA are the same as those of the display device in the first embodiment. As shown in FIG. 6, the auxiliary capacity line driving circuit CA of the display device according to this embodiment uses a first resistive element R1 and a second resistive element R2 in place of the seventh transistor Tr7 and the eighth transistor Tr8.

If the resistance value of the first resistive element R1 and the second resistive element R2 is set so that the first node ND1 can maintain the low level state during the period t1-t3, and the second node ND2 can maintain the low state during the period t3-t52 shown in FIG. 5, the same effect as the display device in the first embodiment can be acquired.

That is, according to the display device in this embodiment, the malfunction of the driving circuit can be avoided, and the high quality display device can be offered.

Next, a liquid crystal display device according to a third embodiment of the present invention is explained with reference to drawings. In addition, in the following explanation about the same composition as the display device in the first embodiment, the same mark is attached and the explanation is omitted.

Figure 7:
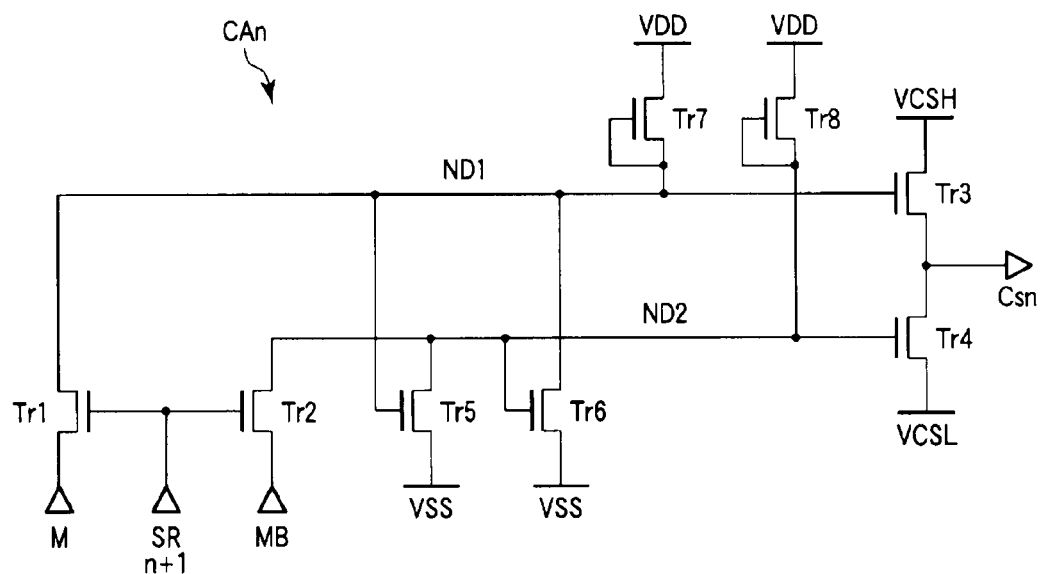
FIG. 7 is a figure showing an auxiliary capacity line driving circuit used in the liquid crystal display device according to a third embodiment.

As shown in FIG. 7, as for the auxiliary capacity line driving circuit CA of the display device according to this embodiment, the control electrodes of the seventh transistor circuit Tr7 and the eighth transistor Tr8 are connected with the first node ND1 and the second node ND2, respectively.

In this case, the seventh transistor Tr7 and the eighth transistor Tr8 become OFF state, and the first node ND1 and the second node ND2 become a floating state. However, the ratio W/L of the seventh transistor Tr7 and the eighth transistor Tr8 is set to be larger than that of the first transistor Tr1, the second transistor Tr2, the fifth transistor Tr5, and the sixth transistor Tr6. That is, the high-level state of the first node ND1 and the second node ND2 is maintained using the OFF leakage current of the seventh transistor Tr7 and the eighth transistor Tr8.

Thus, if the ratio W/L of the first to eighth transistors Tr1-Tr8 is set, the same effect as the display device according to the above-mentioned first embodiment can be acquired. That is, in the display device according to this embodiment, the malfunction of the driving circuit can be avoided, and the high quality display device can be offered.

As explained above, according to this embodiment, the malfunction of the circuit resulting from the excessive OFF leakage current flowing into a transistors can be prevented by arranging transistors or resistive elements and eliminating the floating node in the auxiliary capacity line driving circuit.

In addition, although the first to third embodiments explain about the auxiliary capacity line driving circuit using the NMOS transistor, the PMOS transistor may used to acquire the same effect.

Moreover, although in the first to third embodiments, the explanation is made about the liquid crystal display device as a display device, the application of the driving circuit according to the embodiments is not limited to the liquid crystal display device. The embodiment can be applied to the driving circuit for other display devices, in which a single channel type transistor of either NMOS or PMOS is used for the driving circuit.

While certain embodiments have been described, these embodiments have been presented by way of example only, and are not intended to limit the scope of the inventions. In practice, the structural element can be modified without departing from the spirit of the invention. Various embodiments can be made by properly combining the structural and method elements disclosed in the embodiments. For example, some structural and method elements may be omitted from all the structural and method elements disclosed in the embodiments. Furthermore, the structural and method elements in different embodiments may properly be combined. The accompanying claims and their equivalents are intended to cover such forms or modifications as would fall with the scope and spirit of the inventions.

What is claimed is:

1. A driving circuit, comprising:
    a first transistor having a first electrode to receive a first input signal, a second electrode and a control gate electrode to receive a clock pulse;
    a second transistor having a first electrode to receive a second input signal, a second electrode and a control gate electrode connected with the control gate electrode of the first transistor;
    a third transistor having a first electrode connected with an output terminal, a control gate electrode connected with the second electrode of the first transistor and a second electrode to receive a first voltage;
    a fourth transistor having a control gate electrode connected with the second electrode of the second transistor, a second electrode connected with the output terminal and a first electrode to receive a second voltage;
    a fifth transistor having a control gate electrode connected with the second electrode of the first transistor, a first electrode to receive a third voltage and a second electrode connected with the second electrode of the second transistor;
    a sixth transistor having a control gate electrode connected with the second electrode of the second transistor, a first electrode to receive the third voltage and a second electrode connected with the second electrode of the first transistor;
    a first potential holding device to maintain a conductive state between the first and second electrodes of the third transistor by holding the potential of the control gate electrode of the third transistor at a predetermined level when the first transistor is in a non-conductive state; and
    a second potential holding device to maintain a conductive state between the first and second electrodes of the fourth transistor by holding the potential of the control gate electrode of the fourth transistor at the predetermined level when the second transistor is in a non-conductive state;
    a first node for connecting the second electrode of the first transistor with the control gate electrode of the third transistor;
    a second node for connecting the second electrode of the second transistor with the control gate electrode of the fourth transistor; wherein
    the first potential holding device includes a seventh transistor having a control gate electrode and a first electrode respectively to receive a fourth voltage, and a second electrode electrically connected with the second electrode of the first transistor;

the second potential holding device includes an eighth transistor having a control gate electrode and a first electrode respectively to receive the fourth voltage and a second electrode connected with the second electrode of the second transistor;

a ratio W/L of channel width W to channel length L of the eighth transistor is set to be smaller than that of the fifth transistor so that the second node holds low level when both of the eighth and fifth transistors are rendered conductive; and a ratio W/L of channel width W to channel length L of the seventh transistor is set to be smaller than that of the sixth transistor so that the first node holds low level when both of the seventh and sixth transistors are rendered conductive.

2. A driving circuit, comprising:

a first transistor having a first electrode to receive a first input signal, a second electrode and a control gate electrode to receive a clock pulse;

a second transistor having a first electrode to receive a second input signal, a second electrode and a control gate electrode connected with the control gate electrode of the first transistor;

a third transistor having a first electrode connected with an output terminal, a control gate electrode connected with the second electrode of the first transistor and a second electrode to receive a first voltage;

a fourth transistor having a control gate electrode connected with the second electrode of the second transistor, a first electrode to receive a second voltage and a second electrode connected with the output terminal;

a fifth transistor having a control gate electrode connected with the second electrode of the first transistor, a first electrode to receive a third voltage and a second electrode connected with the second electrode of the second transistor;

a sixth transistor having a control gate electrode connected with the second electrode of the second transistor, a first electrode to receive the third voltage and a second electrode connected with the second electrode of the first transistor;

a first potential holding device to maintain a conductive state between the first and second electrodes of the third transistor by holding the potential of the control gate electrode of the third transistor at a predetermined level when the first transistor is in a non-conductive state;

a second potential holding device to maintain a conductive state between the first and second electrodes of the fourth transistor by holding the potential of the control gate electrode of the fourth transistor at the predetermined level when the second transistor is in a non-conductive state;

a first node for connecting the second electrode of the first transistor with the control gate electrode of the third transistor;

a second node for connecting the second electrode of the second transistor with the control gate electrode of the fourth transistor; wherein the first potential holding device includes a seventh transistor having a first electrode to receive a fourth voltage, and a control gate electrode and a second electrode respectively connected with the second electrode of the first transistor;

the second potential holding device includes an eighth transistor having a first electrode to receive the fourth voltage, and a control gate electrode and a second electrode respectively connected with the second electrode of the second transistor; and ratios W/L of channel width W to channel length L of the seventh and eighth transistors are set to be larger than those of the first, second, fifth and sixth transistors so that the first and second nodes hold high level using OFF leakage current of the seventh and eighth transistors when both of the seventh and eighth transistors are rendered non-conductive.

3. A liquid crystal display device, comprising:

a plurality of pixels arranged in a matrix, auxiliary capacity lines extending along the pixels in the row line; and an auxiliary capacity line driving circuit to drive the auxiliary capacity lines; the auxiliary capacity line driving circuit including:

a first transistor having a first electrode to receive a first input signal, a second electrode and a control gate electrode to receive a clock pulse;

a second transistor having a first electrode to receive a second input signal, a second electrode and a control gate electrode connected with the control gate electrode of the first transistor;

a third transistor having a first electrode connected with an output terminal, a second electrode to receive a first voltage and a control gate electrode connected with the second electrode of the first transistor;

a fourth transistor having a control gate electrode connected with the second electrode of the second transistor, a first electrode to receive a second voltage and a second electrode connected with the output terminal;

a fifth transistor having a control gate electrode connected with the second electrode of the first transistor, a first electrode to receive a third voltage and a second electrode connected with the second electrode of the second transistor;

a sixth transistor having a control gate electrode connected with the second electrode of the second transistor, a first electrode to receive the third voltage and a second electrode connected with the second electrode of the first transistor;

a first potential holding device to maintain a conductive state between the first and second electrodes of the third transistor by holding the potential of the control gate electrode of the third transistor at a predetermined level when the first transistor is in a non-conductive state;

a second potential holding device to maintain a conductive state between the first and second electrodes of the fourth transistor by holding the potential of the control gate electrode of the fourth transistor at the predetermined level when the second transistor is in a non-conductive state;

a first node for connecting the second electrode of the first transistor with the control gate electrode of the third transistor;

a second node for connecting the second electrode of the second transistor with the control gate electrode of the fourth transistor; wherein the first potential holding device includes a seventh transistor having a control gate electrode and a first electrode respectively to receive a fourth voltage, and a second electrode electrically connected with the second electrode of the first transistor;

the second potential holding device includes an eighth transistor having a control gate electrode and a first electrode respectively to receive the fourth voltage and a second electrode connected with the second electrode of the second transistor;

a ratio W/L of channel width W to channel length L of the eighth transistor is set to be smaller than that of the fifth transistor so that the second node holds low level when both of the eighth and fifth transistors are rendered conductive; and a ratio W/L of channel width W to channel length L of the seventh transistor is set to be smaller than that of the sixth transistor so that the first node holds low level when both of the seventh and sixth transistors are rendered conductive.

4. A liquid crystal display device, comprising:

a plurality of pixels arranged in a matrix;

auxiliary capacity lines extending along the pixels in the row line; and an auxiliary capacity line driving circuit to drive the auxiliary capacity lines; the auxiliary capacity line driving circuit including:

a first transistor having a first electrode to receive a first input signal, a second electrode and a control gate electrode to receive a clock pulse;

a second transistor having a first electrode to receive a second input signal, a second electrode and a control gate electrode connected with the control gate electrode of the first transistor;

a third transistor having a first electrode connected with an output terminal, a control gate electrode connected with the second electrode of the first transistor and a second electrode to receive a first voltage;

a fourth transistor having a control gate electrode connected with the second electrode of the second transistor, a first electrode to receive a second voltage and a second electrode connected with the output terminal;

a fifth transistor having a control gate electrode connected with the second electrode of the first transistor, a first electrode to receive a third voltage and a second electrode connected with the second electrode of the second transistor;

a sixth transistor having a control gate electrode connected with the second electrode of the second transistor, a first electrode to receive the third voltage and a second electrode connected with the second electrode of the first transistor;

a first potential holding device to maintain a conductive state between the first and second electrodes of the third transistor by holding the potential of the control gate electrode of the third transistor at a predetermined level when the first transistor is in a non-conductive state;

a second potential holding device to maintain a conductive state between the first and second electrodes of the fourth transistor by holding the potential of the control gate electrode of the fourth transistor at the predetermined level when the second transistor is in a non-conductive state;

a first node for connecting the second electrode of the first transistor with the control gate electrode of the third transistor;

a second node for connecting the second electrode of the second transistor with the control gate electrode of the fourth transistor; wherein the first potential holding device includes a seventh transistor having a first electrode to receive a fourth voltage, and a control gate electrode and a second electrode respectively connected with the second electrode of the first transistor;

the second potential, holding device includes an eighth transistor having a first electrode to receive the fourth voltage, and a control gate electrode and a second electrode respectively connected with the second electrode of the second transistor; and ratios W/L of channel width W to channel length L of the seventh and eighth transistors are set to be larger than those of the first, second, fifth and sixth transistors so that the first and second nodes hold high level using OFF leakage current of the seventh and eighth transistors when both of the seventh and eighth transistors are rendered non-conductive.

\* \* \* \* \*